United States Patent
Huisinga et al.

(10) Patent No.: US 8,673,770 B2
(45) Date of Patent: Mar. 18, 2014

(54) METHODS OF FORMING CONDUCTIVE STRUCTURES IN DIELECTRIC LAYERS ON AN INTEGRATED CIRCUIT DEVICE

(75) Inventors: Torsten Huisinga, Dresden (DE); Jens Heinrich, Wachau (DE); Ronny Pfuetzner, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 43 days.

(21) Appl. No.: 13/281,105

(22) Filed: Oct. 25, 2011

(65) Prior Publication Data
US 2013/0102147 A1    Apr. 25, 2013

(51) Int. Cl.
*H01L 21/768* (2006.01)

(52) U.S. Cl.
USPC ............ 438/637; 257/E21.029; 257/E21.257; 257/E21.277; 257/E21.579; 438/723; 438/692; 438/586; 438/724; 438/622

(58) Field of Classification Search
USPC ................... 257/E21.029, E21.257, E21.277, 257/E21.579; 438/637, 723, 692, 586, 724, 438/622
See application file for complete search history.

(56) References Cited

U.S. PATENT DOCUMENTS

| | | | |
|---|---|---|---|
| 4,942,137 A | 7/1990 | Sivan et al. | |
| 5,705,430 A | 1/1998 | Avanzino et al. | |
| 5,866,485 A * | 2/1999 | Kirchhoff et al. | 438/740 |
| 6,365,506 B1 * | 4/2002 | Chang et al. | 438/624 |
| 6,660,619 B1 * | 12/2003 | Pangrle et al. | 438/586 |
| 6,710,450 B2 * | 3/2004 | Gates et al. | 257/759 |
| 6,780,763 B2 | 8/2004 | Lee | |
| 6,849,549 B1 * | 2/2005 | Chiou et al. | 438/692 |
| 7,122,484 B2 * | 10/2006 | Perng et al. | 438/765 |
| 7,416,992 B2 * | 8/2008 | Lehr et al. | 438/723 |
| 7,723,172 B2 | 5/2010 | Ishiguro | |
| 7,898,064 B2 | 3/2011 | Tuttle | |
| 7,902,059 B2 | 3/2011 | Kim et al. | |
| 7,915,162 B2 | 3/2011 | Anderson et al. | |
| 7,977,237 B2 * | 7/2011 | Feustel et al. | 438/634 |
| 8,053,374 B2 | 11/2011 | Choi et al. | |

* cited by examiner

Primary Examiner — Thao Le
Assistant Examiner — Sheng Zhu
(74) *Attorney, Agent, or Firm* — Amerson Law Firm, PLLC

(57) ABSTRACT

One method disclosed herein includes the steps of forming a ULK material layer, forming a hard mask layer above the ULK material layer, forming a patterned photoresist layer above the hard mask layer, performing at least one etching process to define an opening in at least the ULK material layer for a conductive structure to be positioned in at least the ULK material layer, forming a fill material such that it overfills the opening, performing a process operation to remove the patterned photoresist layer and to remove the fill material positioned outside of the opening, removing the fill material from within the opening and, after removing the fill material from within the opening, forming a conductive structure in the opening.

22 Claims, 4 Drawing Sheets

METHODS OF FORMING CONDUCTIVE STRUCTURES IN DIELECTRIC LAYERS ON AN INTEGRATED CIRCUIT DEVICE

BACKGROUND OF THE INVENTION

1. Field of the Invention

Generally, the present disclosure relates to the manufacturing of sophisticated semiconductor devices, and, more specifically, to various methods of forming conductive structures in dielectric layers on an integrated circuit devices.

2. Description of the Related Art

The fabrication of advanced integrated circuits, such as CPU's, storage devices, ASIC's (application specific integrated circuits) and the like, requires the formation of a large number of field effect transistors (NMOS and PMOS transistors) that substantially determine performance of the integrated circuits. Device designers are under constant pressure to increase the operating speed and electrical performance of transistors and integrated circuit products that employ such transistors. Thus, in modern ultra-high density integrated circuits, device features, like the channel length, have been steadily decreased in size to enhance the performance of the transistors and the overall functionality of the circuit. Given that the channel length (the distance between the source and drain regions) on modern transistor devices may be approximately 30-50 nm, and that further scaling is anticipated in the future, device designers have employed a variety of additional techniques in an effort to improve device performance, e.g., the use of high-k dielectrics, the use of highly-conductive copper lines and vias to provide electrical wiring connections to the transistors, the use metal gate electrode structures, the incorporation of work function metals in the gate electrode structure and the use of channel stress engineering techniques on transistors (create a tensile stress in the channel region for NMOS transistors and create a compressive stress in the channel region for PMOS transistors).

However, the ongoing shrinkage of feature sizes on transistor devices causes certain problems that may at least partially offset the advantages that may be obtained by reduction of the device features. Generally, as the device dimensions have decreased, the physical size of the conductive interconnections, e.g., metal lines and metal vias formed in multiple metallization layers above the device level, have also become smaller. Thus, improving the functionality and performance capability of various metallization systems has become important in designing modern semiconductor devices. One example of such improvements is the enhanced use of copper metallization systems in integrated circuit devices and the use of so-called "low-k" dielectric materials (materials having a dielectric constant less than 3) and "ultra-low-k" (ULK) dielectric materials (materials having a dielectric constant less than 2.7) in such devices. Copper metallization systems exhibit improved electrical conductivity as compared to, for example, prior art metallization systems using tungsten for the conductive lines and vias. The use of low-k and ULK dielectric materials also tends to improve the signal-to-noise ratio (S/N ratio) by reducing crosstalk as compared to other dielectric materials with higher dielectric constants.

However, the use of such ULK dielectric materials can be problematic as they tend to be less resistant to metal migration as compared to some other dielectric materials. As one example, ULK materials tend to have less mechanical strength than other, higher-k value materials, such as silicon dioxide. Another problem associated with the use of some dielectric materials, such as, for example, ULK materials, is that such materials are subject to being damaged during processing operations. FIG. 1 depicts an illustrative prior art metallization layer 100. The metallization layer 100 generally comprises a plurality of schematically depicted conductive lines 14 and a conductive via 16 formed in an illustrative ULK layer 10. Also depicted in FIG. 1 is an illustrative layer 12 that acts to passivate underlying conductive lines (not shown) formed in the metallization layer (not shown) formed below the metallization layer 100 depicted in FIG. 1. The layer 12 may also perform other functions such as acting as a stop layer for a chemical mechanical polishing (CMP) operation performed on the underlying metallization layer. The conductive lines and vias 14, 16 may be made of a variety of materials, such as copper, tungsten, etc., and they may be formed by performing a variety of known techniques. One illustrative process flow would include the following steps: (1) deposit the ULK layer 10; form a hard mask material (not shown in FIG. 1) above the ULK layer 10; (3) form a patterned resist mask (not shown) above the hard mask layer; (4) perform one or more etching processes to define various openings in the UKL layer 10; (5) strip the photoresist mask, typically by performing a plasma-based stripping or so-called ashing process; (6) form the appropriate conductive materials in the openings in the ULK layer 10 (such as by forming one or more barrier layers and thereafter blanket-depositing a conductive material in the openings in the ULK layer 10).

The resist stripping process tends to damage the ULK layer 10 as schematically depicted by the damaged regions 18 shown in FIG. 1. The extent and amount of such damage may vary depending upon the particular application. Moreover, in some cases the damaged regions 18 may not be uniform for all openings, as reflected in FIG. 1. The thickness of the damaged regions 18 can also vary depending upon the particular application and the particular ULK material 10 being used. In one example, the damaged regions 18 may have a thickness 19 that ranges from 5-40 nm. The damaged regions 18 may reflect a loss of ULK material, a formation of air gaps in the ULK material and/or an undesirable, localized increase in the k value of the ULK material. In some cases, the k value of the damage regions 18 can exhibit be increased by about 10-50%, relative the un-damaged ULK material. Such localized increased in k value due to the damaged regions 18 may undesirably increase the overall k value of the ULK layer 10, thereby tending to reduce the desired insulating characteristics of the overall ULK layer 10, which may lead to a decrease in the electrical performance characteristics a resulting integrated circuit device incorporating the metallization layer 100.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming conductive structures in dielectric layers such as, for example, ULK dielectric layers, on integrated circuit devices. In one example, the method includes the steps of forming a ULK material layer having a dielectric constant less than 2.7, forming a hard mask layer above the ULK material layer, forming a patterned photoresist layer above the hard mask layer and performing at least one etching process to define an opening in at least the ULK material layer for a conductive structure to be positioned in at least the ULK material layer. The illustrative method further includes the steps of forming a fill material such that it overfills the opening, performing a process operation to remove the patterned photoresist layer and to remove the fill material positioned outside of the opening, removing the fill material from within the opening and, after removing the fill material from within the opening, forming a conductive structure in the opening.

In yet another illustrative example, a method disclosed herein includes the steps of forming an insulating material layer, forming a hard mask layer above the insulating material layer and forming a patterned photoresist layer above the hard mask layer. This illustrative method further includes the steps of performing at least one etching process to define an opening in at least the insulating material layer for a conductive structure to be positioned in at least the insulating material layer, forming a fill material such that it overfills the opening, performing a process operation to remove the patterned photoresist layer and to remove the fill material positioned outside of said opening, removing the fill material from within the opening and, after removing the fill material from within the opening, forming a conductive structure in the opening.

BRIEF DESCRIPTION OF THE DRAWINGS

The disclosure may be understood by reference to the following description taken in conjunction with the accompanying drawings, in which like reference numerals identify like elements, and in which.

Figure 1:
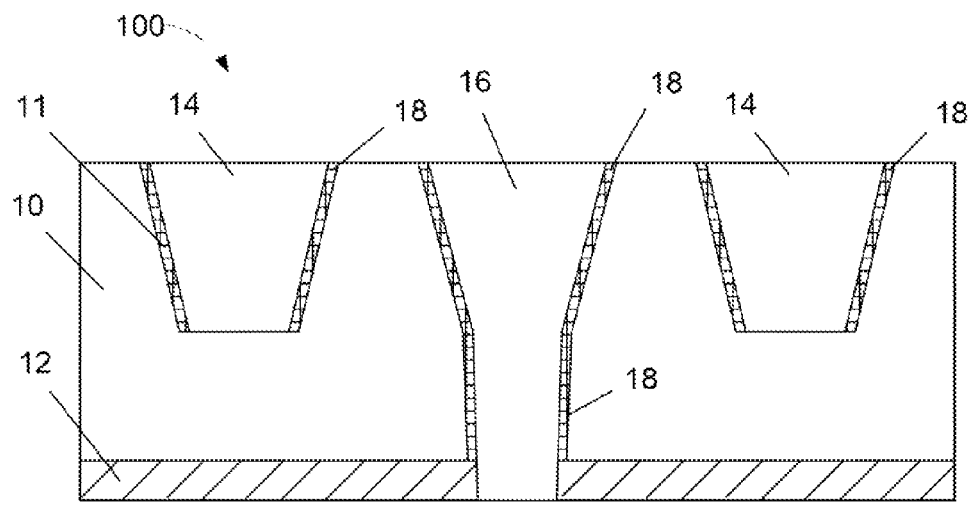
FIG. 1 depicts one illustrative example of conductive structures, such as metal lines and via, formed in a layer of insulating material.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to various methods of forming conductive structures in dielectric layers on integrated circuit devices. As will be readily apparent to those skilled in the art upon a complete reading of the present application, the present method is applicable to use with a wide variety of different types or classes of insulating layers, e.g., ULK layers, high-k layers (k value greater than 10), etc. Moreover, the various methods disclosed herein made be employed in a variety of technologies, e.g., NMOS, PMOS, CMOS, etc., and they may be used with a variety of devices, including, but not limited to, logic devices, memory devices, etc. With reference to FIGS. 2A-2F, various illustrative embodiments of the methods disclosed herein will now be described in more detail.

Figure 2A:
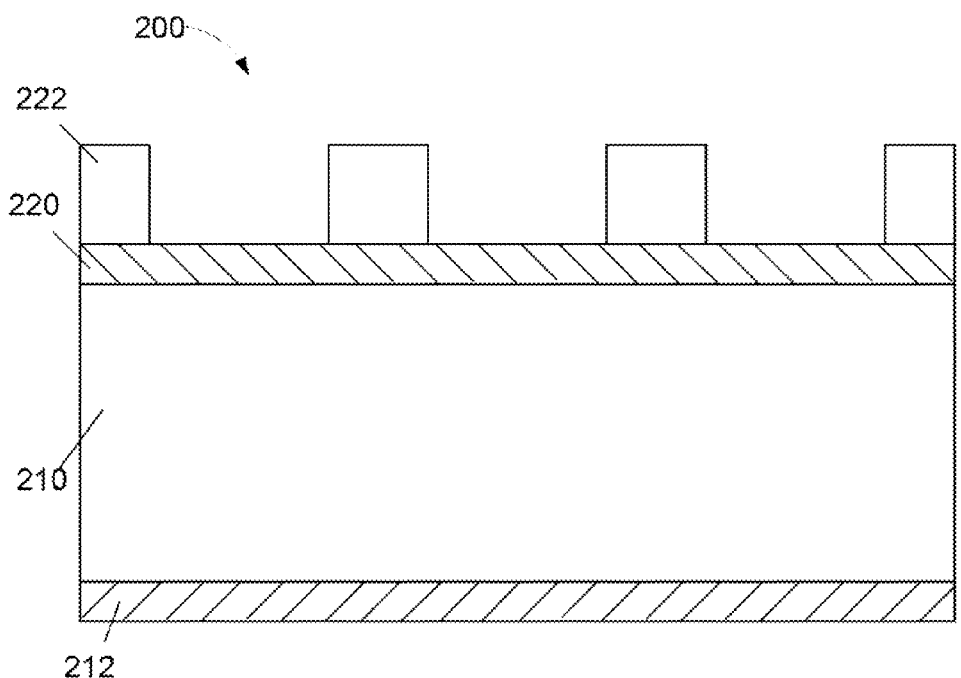
FIGS. 2A-2F depict one illustrative novel process flow described herein for forming conductive structures in a layer of insulating material.

FIG. 2A is a simplified view of what will become an illustrative metallization layer 200 for an integrated circuit device at an early stage of manufacturing. The metallization layer 200 is formed above a semiconducting substrate. At the point of fabrication depicted in FIG. 2A, the metallization layer 200 comprises an insulating material layer 210 formed above a layer 212, and a patterned resist mask 222 formed above a hard mask layer 220. In one illustrative embodiment, the insulating layer may be, for example, a layer of ULK insulating material. The various components and structures of the metallization layer 200 may be formed using a variety of different materials and by performing a variety of known techniques. For example, the layers 212, 210 and 220 may be formed by performing a variety of techniques, such as a chemical vapor deposition (CVD) process, an atomic layer deposition (ALD) process, or plasma enhanced versions of such processes, etc. and the thicknesses of such layers may vary depending the particular application.

The layer 212 may be comprised of a variety of materials, such as, for example, silicon nitride, NBLOK, a bi-layer comprised of, for example, a combination of materials, such as NBLOK, SiCN, SiC, etc., and it may have an illustrative thickness that ranges from 5-200 nm. The layer 212 acts to passivate underlying conductive lines (not shown) formed in the metallization layer (not shown) formed below the metallization layer 200 depicted in FIG. 2A. The layer 212 may also perform other functions such as acting as a stop layer for a chemical mechanical polishing (CMP) operation performed on the underlying metallization layer. In one illustrative example, the insulating material layer 210 may be a ULK material comprised of any insulating material have a k value less than 2.7, it may have a thickness of about 50-600 nm depending upon the application, and it may be formed by performing a CVD process. The hard mask layer 220 may also be comprised of a variety of materials, such as silicon dioxide (TEOS based), SiCOH, TiN, SiON, etc., or any other material that is selectively etchable relative to the layer 212, and it may have a thickness that ranges from, for example 10-30 nm. The layer 212 may also act as an CMP stop layer. The patterned resist mask 222 may be formed by performing known photolithography techniques.

Figure 2B:
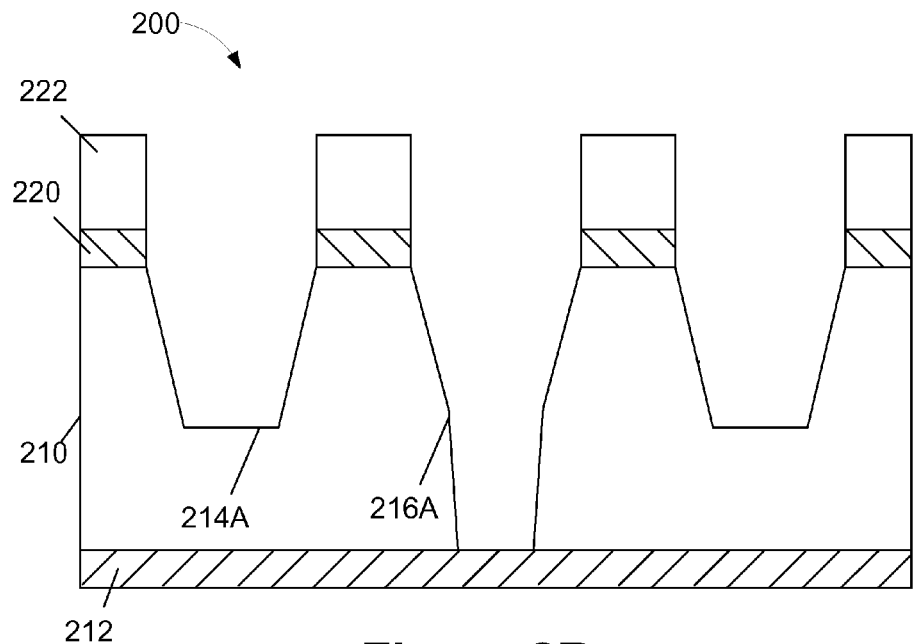

Next, as shown in FIG. 2B, one or more etching processes are performed through the patterned masking layer 222 to form openings 214A, 216A for conductive structures, e.g., conductive lines and vias, respectively. Such conductive structures that will be formed in the openings 214A, 216A will part of the metallization system that provide electrical connection for the various electrical circuits that will be formed on an integrated circuit device. More specifically, in one illustrative embodiment, one or more etching processes are performed on the hard mask layer 220 and the insulating material layer 210 to define the openings 214A, 216A. In this illustrative example, an opening in the layer 212, to expose an underlying metal line (not shown) has not yet been formed. However, if desired, an etching process could be performed at this time to etch through the layer 212 and expose the underlying conductive metal line. The etching processes are performed with appropriate etch chemistries to etch through the various layers of material. The etching process can be either wet or dry etching processes. Of course, the size, shape and configuration of the openings 214A, 216A may vary depending on the particular application.

Figure 2C:
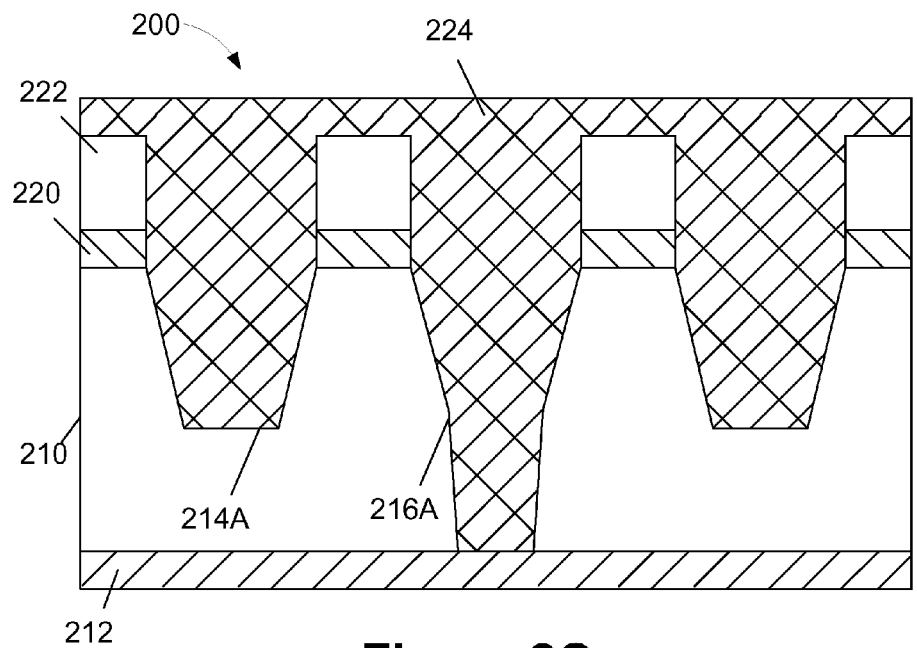

Next, as shown in FIG. 2C, a fill material 224 is formed above the resist mask 222 and in the openings 214A, 216A for the conductive structures. The fill material 224 may be comprised of a variety of materials such as, for example, an optical planarization (OPL) material, etc., and it may be formed by a variety of techniques. In one illustrative embodiment, the fill material is an OPL material that is formed by performing a spin-coating process. In the depicted example, the fill material 224 overfills the opening 214A, 216A and the upper surface of the fill material 224 is positioned above the upper surface of the resist mask 222, although this amount of overfilling may not be required in all applications.

Figure 2D:
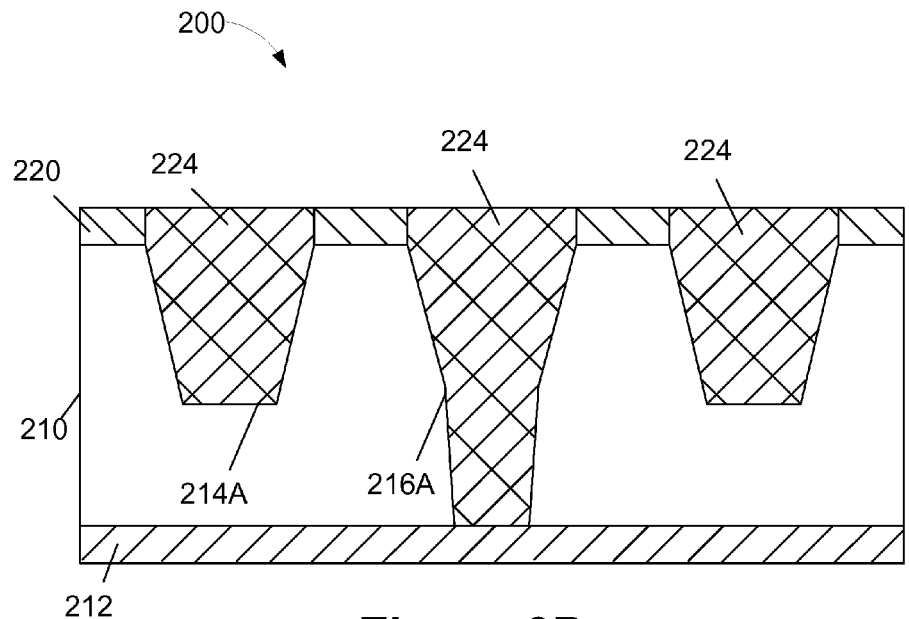

Next, as shown in FIG. 2D, a process is performed to remove the resist mask 222 and portions of the fill material 224 positioned outside of the openings 214A, 216A. The process may be either a CMP process or one or more etching processes. In the case where a CMP process is performed to remove the resist mask 222 and the excess fill material 224, the hard mask 220 acts as a CMP stop layer. In the case where one or more etching processes are performed to remove the resist mask 222 and the excess fill material 224, the hard mask 220 acts as an etch stop layer.

Figure 2E:
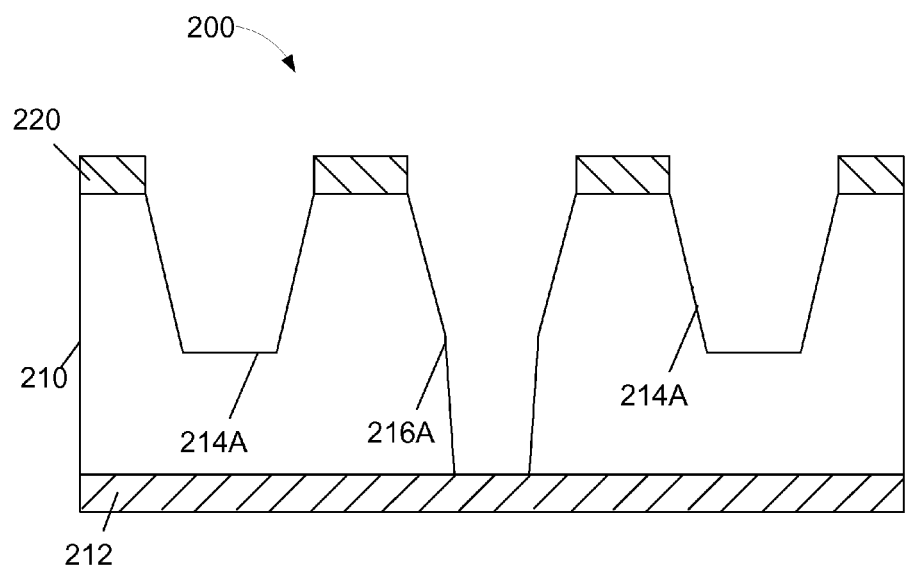

Next, as shown in FIG. 2E, a process is performed to remove the fill material 224 positioned with the openings 214A, 216A. In one illustrative example, the fill material 224 may be removed by using an etching medium that does not attack or damage the insulating material layer 210. For example, a wet etching or wet stripping/cleaning process may be performed to remove the fill material 224. In one illustrative embodiment, where the fill material 224 is an OPL material, the fill material 224 may be removed from the opening by performing a wet cleaning process using an organic solvent.

Figure 2F:
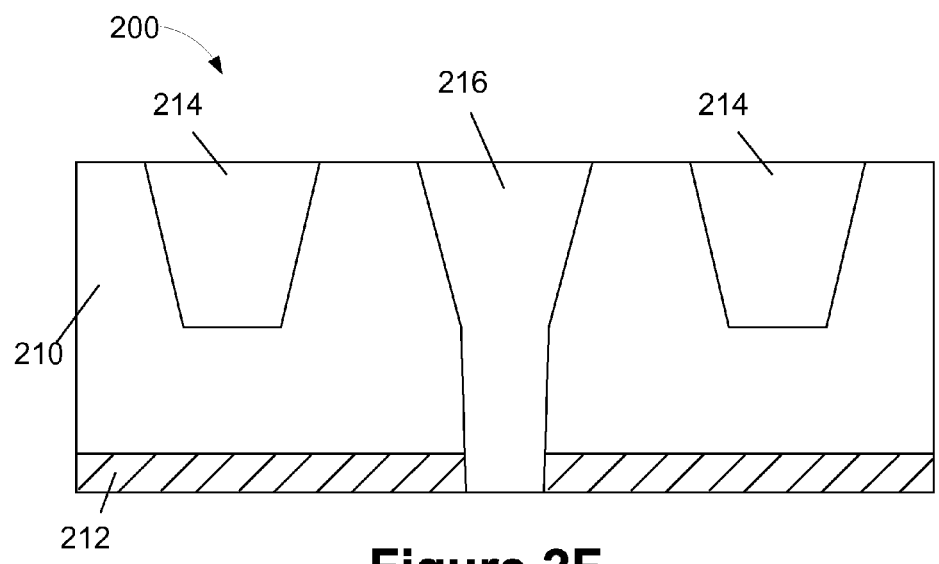

Next, as shown in FIG. 2F, an etching process is performed on the layer 212 (to expose the underlying conductive line (not shown)) and the conductive structures, e.g., a plurality of conductive metal lines 214 and a conductive via 216 are formed in the openings 214A, 216A, respectively. The conductive structures 214, 216 may be comprised of a variety of materials, e.g., copper, titanium, tungsten, aluminum, etc. The conductive structures 214, 216 may be formed by using any of a variety of known techniques. For example, the conductive structures 214, 216 may be formed by depositing a conductive material in the openings 214A, 216A and thereafter performing a CMP process to remove excess portions of the conductive material positioned outside of openings 214A, 216A. Of course, those skilled in the art will appreciate that the conductive structures 214, 216 depicted in the drawings are schematic and illustrative in nature. For example, although not depicted in the drawings one or more barrier layers of material may also be formed in the openings 214A, 216A.

By using the novel process flow described herein, one or more of the problems identified in the background section of this application may be at least reduced. More specifically, by removing the resist mask 222 using the techniques described herein, the insulating material layer 210 may not be subjected to at least some of the damage associated with removing the photoresist mask layer using prior art stripping/ashing techniques.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a ULK material layer having a dielectric constant less than 2.7;
   forming a hard mask layer above said ULK material layer;
   forming a patterned photoresist layer above said hard mask layer;
   performing at least one etching process to define an opening in at least said ULK material layer for a conductive structure to be positioned in at least said ULK material layer;
   forming a fill material such that it overfills said opening while maintaining said patterned photoresist layer and said hard mask layer above said ULK material layer;
   performing a process operation to remove said patterned photoresist layer and to remove said fill material positioned outside of said opening;
   removing said fill material from within said opening; and
   after removing said fill material from within said opening, forming a conductive structure in said opening.

2. The method of claim 1, wherein said hard mask layer is formed on said ULK material layer and said patterned photoresist layer is formed on said hard mask layer.

3. The method of claim 1, wherein performing said process operation to remove said patterned photoresist layer and to remove said fill material positioned outside of said opening comprises performing a chemical mechanical polishing process to remove said patterned photoresist layer and to remove said fill material positioned outside of said opening.

4. The method of claim 1, wherein performing said process operation to remove said patterned photoresist layer and to remove said fill material positioned outside of said opening comprises performing at least one etching process to remove said patterned photoresist layer and to remove said fill material positioned outside of said opening.

5. The method of claim 1, wherein forming said fill material comprises performing a spin coating process to form said fill material.

6. The method of claim 1, wherein forming said fill material such that it overfills said opening comprises forming said fill material such that it overfills said opening and such that it has an upper surface that extends above an upper surface of said patterned photoresist layer.

7. The method of claim 1, wherein said conductive structure is one of a conductive line or a conductive via.

8. The method of claim 1, wherein conductive structure is comprised of at least one of copper, aluminum, titanium or tantalum.

9. The method of claim 1, wherein said ULK material layer is comprised of an optical planarization (OPL) material.

10. A method, comprising:
forming a ULK material layer having a dielectric constant less than 2.7;
forming a hard mask layer above said ULK material layer;
forming a patterned photoresist layer above said hard mask layer;
performing at least one etching process to define an opening in at least said ULK material layer for a conductive structure to be positioned in at least said ULK material layer;
forming a fill material such that it overfills said opening and has an upper surface that is positioned above an upper surface of the patterned photoresist layer;
performing a chemical mechanical planarization process to remove said patterned photoresist layer and to remove said fill material positioned outside of said opening;
removing said fill material from within said opening; and after removing said fill material from within said opening, forming a conductive structure in said opening.

11. The method of claim 10, wherein forming said fill material comprises performing a spin coating process to form said fill material.

12. The method of claim 10, wherein said conductive structure is one of a conductive line or a conductive via.

13. A method, comprising:
forming a ULK material layer having a dielectric constant less than 2.7;
forming a hard mask layer above said ULK material layer;
forming a patterned photoresist layer above said hard mask layer;
performing at least one etching process to define an opening in at least said ULK material layer for a conductive structure to be positioned in at least said ULK material layer;
forming a fill material such that it overfills said opening and has an upper surface that is positioned above an upper surface of the patterned photoresist layer;
performing at least one etching process to remove said patterned photoresist layer and to remove said fill material positioned outside of said opening;
removing said fill material from within said opening; and after removing said fill material from within said opening, forming a conductive structure in said opening.

14. The method of claim 13, wherein forming said fill material comprises performing a spin coating process to form said fill material.

15. The method of claim 13, wherein said conductive structure is one of a conductive line or a conductive via.

16. A method, comprising:
forming an insulating material layer;
forming a hard mask layer above said insulating material layer;
forming a patterned photoresist layer above said hard mask layer;
performing at least one etching process to define an opening in at least said insulating material layer for a conductive structure to be positioned in at least said insulating material layer;
forming a fill material such that it overfills said opening;
after forming said fill material, performing a process operation to remove said patterned photoresist layer and to remove said fill material positioned outside of said opening;
removing said fill material from within said opening; and
after removing said fill material from within said opening, forming a conductive structure in said opening.

17. The method of claim 16, wherein said hard mask layer is formed on said insulating material layer and said patterned photoresist layer is formed on said hard mask layer.

18. The method of claim 16, wherein performing said process operation to remove said patterned photoresist layer and to remove said fill material positioned outside of said opening comprises performing a chemical mechanical polishing process to remove said patterned photoresist layer and to remove said fill material positioned outside of said opening.

19. The method of claim 16, wherein performing said process operation to remove said patterned photoresist layer and to remove said fill material positioned outside of said opening comprises performing at least one etching process to remove said patterned photoresist layer and to remove said fill material positioned outside of said opening.

20. The method of claim 16, wherein forming said fill material such that it overfills said opening comprises forming said fill material such that it overfills said opening and such that it has an upper surface that extends above an upper surface of said patterned photoresist layer.

21. The method of claim 16, wherein said conductive structure is one of a conductive line or a conductive via.

22. The method of claim 17, wherein said insulating material layer is comprised of an insulating material having a dielectric constant less than 2.7 and wherein said conductive structure is one of a conductive line or a conductive via.

* * * * *